(12) United States Patent
Yasukawa et al.

(10) Patent No.: US 7,553,208 B2
(45) Date of Patent: Jun. 30, 2009

(54) MANUFACTURING METHOD OF ORGANIC ELECTROLUMINESCENCE DISPLAY DEVICE

(75) Inventors: Akiko Yasukawa, Kokubunji (JP); Shoichi Uchino, Annaka (JP); Emiko Yamada, Hachioji (JP); Nobuaki Hayashi, Kunitachi (JP)

(73) Assignee: Hitachi Displays, Ltd., Mobara-shi (JP)

( * ) Notice: Subject to any disclaimer, the term of this patent is extended or adjusted under 35 U.S.C. 154(b) by 377 days.

(21) Appl. No.: 11/639,205

(22) Filed: Dec. 15, 2006

(65) Prior Publication Data

US 2007/0087646 A1   Apr. 19, 2007

Related U.S. Application Data

(63) Continuation of application No. 10/852,401, filed on May 25, 2004, now abandoned.

(30) Foreign Application Priority Data

May 30, 2003   (JP) .............................. 2003-154715

(51) Int. Cl.
  *H01L 51/56* (2006.01)
  *H01L 51/50* (2006.01)
(52) U.S. Cl. .............................. 445/24; 445/25; 427/66
(58) Field of Classification Search .................. 445/24, 445/25; 427/66
  See application file for complete search history.

(56) References Cited

U.S. PATENT DOCUMENTS 6,114,183 A * 9/2000 Hamada et al. ............. 313/504
6,232,713 B1 * 5/2001 Hamada ..................... 313/500
6,551,724 B2   4/2003 Ishii et al.
7,026,757 B1 * 4/2006 Kobayashi .................. 427/66
2001/0026846 A1  10/2001 Yamazaki et al.
2003/0080678 A1   5/2003 Kim et al.
2006/0045959 A1 * 3/2006 Yasukawa et al. ............ 427/66

FOREIGN PATENT DOCUMENTS

| JP | 9-230129 | | 9/1997 |
|----|----|----|----|
| JP | 10-12377 | | 1/1998 |
| JP | 11-87062 | | 3/1999 |
| JP | 11185968 | A * | 7/1999 |
| JP | 2001210469 | A * | 8/2001 |

* cited by examiner

*Primary Examiner*—Mariceli Santiago
(74) *Attorney, Agent, or Firm*—Antonelli, Terry, Stout & Kraus, LLP.

(57) ABSTRACT

A manufacturing method of organic electroluminescence display device according to the present invention performs (1) a first step for forming a non-affinity region in a surface of an anode provided in each of pixels arranged on a glass substrate by exposing the glass substrate in a saturated vapor pressure of an organic solvent, (2) a second step for forming an affinity region in a central portion of the anode surface spaced from its edges by irradiating the central portion of the anode surface with ultraviolet light, and (3) a third step for forming polymer material layers which constitute an organic electroluminescent element in the each of the pixels in the affinity region by blowing off polymer material solutions onto the affinity region of the anode in the each of the pixels, in this order, to simplify entire steps in, to reduce cost for, and to improve productivity of the manufacturing process of the organic electroluminescence display device thereby.

1 Claim, 6 Drawing Sheets

MANUFACTURING METHOD OF ORGANIC ELECTROLUMINESCENCE DISPLAY DEVICE

This application is a Continuation application of application Ser. No. 10/852,401, filed May 25, 2004, now abandoned the contents of which are incorporated herein by reference in their entirety.

The present application claims priority from Japanese application JP 2003-154715, filed on May 30, 2003, the content of which is hereby incorporated by reference into this application.

BACKGROUND OF THE INVENTION

The present invention relates to a method of manufacture of an organic electroluminescence display device using organic electroluminescence, and, more particularly, the invention relates to an image forming method in which a polymer light emitting material solution is held and formed at given pixel center portions while making the formation of partition walls (banks) which define the pixels unnecessary.

An organic electroluminescence device, which utilizes mainly an organic material as field light emitting elements, is suitable for an application as a planar display; and, hence, an extensive development has been under way and the remarkable progress has been made in fields such as materials, element structures, fabrication techniques for light emission.

To constitute a highly reliable planar display device using organic electroluminescent elements of this type, it is necessary to accurately arrange light emitting elements using an organic material having a light emitting property of high efficiency on a pixel area portion of an insulation substrate made of glass or the like to serve as organic electroluminescence elements. In addition to the above-mentioned arrangement, to provide a display device of high quality and high reliability in which the light emitting efficiency and the light emitting luminance are enhanced for a long period in a stable manner over a long lifetime, a technique to properly form pixels constituted of organic electroluminescent elements on an insulation substrate becomes crucially important. Here, some tasks which are required for the formation of the pixels are versatile, as described below.

Conventionally, with the development of a technique for putting the planar display device using organic electroluminescence elements of this type into practice, in a polymer-based organic electroluminescent element which forms a light emitting material film using an ink jet method, to hold an organic material solution (ink) in the inside of the pixels while preventing a flowing out of the organic material solution to neighboring pixels, it has been proposed to form banks, which define respective pixels, and, thereafter, to form a hole injection layer and a light emitting layer.

As an example, the following "patent literature 1" discloses a structure which can realize a full color display, wherein, by forming banks, organic light emitting layers having respective light emitting colors of red, green and blue can be arbitrarily patterned for every pixel by forming and arranging organic electroluminescence materials whose patterning was considered impossible conventionally using an ink jet method.

Further, the following "patent literature 2" discloses a structure which can realize a vivid color display, wherein by using a bank material which is water-repellant and oil-repellant with respect to various inks, it is possible to prevent color mixing of inks between pixels which may occur due to bridging over of a material having a hole injection layer and a light emitting layer between the pixels, thus making fluorescent materials in use emit lights of colors of the fluorescent materials faithfully.

Further, the following "patent literature 3" discloses a structure which can prevent thin-film-forming-material ink from flowing out to neighboring pixels and, at the same time, can obtain a uniform film thickness by forming banks, such that a material which exhibits affinity with the ink and a material which exhibits non-affinity with ink are alternately stacked. Here, the non-affinity with the ink is given to the banks by applying a fluorine plasma treatment to the banks.

Further, the following "patent literature 4" discloses a method in which, in the manufacture of color filters, energy rays are irradiated to pixel portions on a substrate to make the pixel portions have an affinity with ink, thus reducing the occurrence of defects attributed to a repelling of the ink.

Further, the following "patent literature 5" discloses a manufacturing method of manufacture of an organic electroluminescence element in which ultraviolet rays are irradiated to upper surfaces of anodes so as to improve the adhesiveness with an organic material (a hole injection layer) formed on the upper surfaces of the anodes.

The patent literatures referred to above are identified as follows.

[Patent Literature 1]
Japanese Unexamined Patent Publication Hei10 (JP-A-1998)-12377

[Patent Literature 2]
Japanese Unexamined Patent Publication Hei11 (JP-A-1999)-87062

[Patent Literature 3]
Japanese Unexamined Patent Publication Hei11 (JP-A-1999)-271753, and its counterpart U.S. Pat. No. 6,476,988.

[Patent Literature 4]
Japanese Unexamined Patent Publication Hei9 (JP-A-1997)-230129

[Patent Literature 5]
Japanese Unexamined Patent Publication Hei10 (JP-A-1998)-261484, and its counterpart U.S. Pat. No. 6,060,826.

SUMMARY OF THE INVENTION

However, in the technology referred to above, to form a hole injection layer and a light emitting layer having a thickness of several tens nm using ink having 0.2 to 5% of polymer concentration, it is necessary to form extremely high banks having a thickness of several μm, and, hence, there arises a drawback in that the breaking of steps of the cathodes may easily occur. Further, although it is desirable to form black banks to enhance the contrast of the organic electroluminescence element, it is extremely difficult to form the black banks having a thickness of approximately several μm using a photolithography method in view of the optical transmissivity.

Further, with respect to a method which uses a bank material having a critical surface tension of not more than 30 dyne/cm and which is water-repellant and oil-repellant against ink, the method requires a bank forming process using a photolithography method, and, hence, the number of fabrication steps and the manufacturing cost are increased. Further, the use of bank material having a critical surface tension of not more than 30 dyne/cm limits the range of selection of bank materials.

Still further, with respect to a bank structure which is formed by stacking a material having an affinity with the organic material and a material having a non-affinity with the organic material, the bank structure requires the formation of a bank using a photolithography method, a fluorine plasma treatment process applied to the banks for repelling liquid and the like, and, hence, the number of fabrication steps and the manufacturing cost are increased.

Further, in the typical color filter manufacturing method, the structure which makes the pixel portions on the substrate obtain an affinity to ink by irradiating energy rays to the pixel portions requires a bank forming process using a photolithography method and a process such as the irradiation of energy rays, and, hence, the number of fabrication steps and the manufacturing cost are increased.

Further, in the method in which ultraviolet rays are irradiated to the upper surfaces of the anodes, an organic thin film layer is formed on the upper surfaces of the anodes using an organic material per se by a vapor evaporation method, a sputtering method or a sol-gel method, and, thereafter, the adhesiveness of the organic thin film layer with the organic material layer (hole injection layer) which is formed on the upper surfaces of the anodes is improved in the next step, it is necessary to provide a drying step or the like for drying the formed organic thin film layer, and, hence, the number of fabrication steps is increased and a reduction of the manufacturing cost cannot be realized.

Accordingly, the present invention has been made to overcome the above-mentioned conventional drawbacks, and it is an object of the present invention to provide a method of manufacture of an organic electroluminescence display device in which the fabrication steps are simplified, the cost is reduced, and a high productivity.

Further, it is another object of the present invention to provide a method of manufacture of an organic electroluminescence display device in which it is possible to easily blacken the banks in the organic electroluminescence display device to improve the contrast ratio, and in which it is possible to obtain high-quality display images.

To achieve the above-mentioned objects, the method of manufacture of an organic electroluminescence display device according to the present invention comprises a step of patterning a plurality of anodes for each pixel on a light transmitting glass substrate; a step of forming an outer wall layer which surrounds a region where the anodes are formed by applying a polymer organic material to an outer peripheral portion which surrounds the region where the anodes are formed on the light transmitting glass substrate and by heating and drying the polymer organic material; a step of forming affinity regions by irradiating ultraviolet rays to pixel center portions, except for electrode surface peripheral portions of the anodes; a step of forming hole injection layers on the affinity regions by blowing off a conductive polymer material solution to the affinity regions and by heating and drying the conductive polymer material solution; a step of forming light emitting layers on the hole injection layers by blowing off a polymer light emitting material solution to the hole injection layers and by heating and drying the polymer light emitting material solution; a step of forming a black insulation layer to peripheral portions of the anodes by injecting an organic black insulation material solution to the inside of the anode forming region, which is surrounded by the outer wall layer, and by heating and drying the organic black insulation material solution; a step of forming an electron injection layer on the light emitting layers; a step of forming a cathode on the electron injection layer; a step of forming a protective film on the cathode; and a step of sealing the light transmitting glass substrate and another glass substrate by interposing an ultraviolet curing sealing material between the outer wall layer formed on the light transmitting glass substrate and an inner peripheral portion of the other glass substrate having a drying material on an inner surface side thereof and then irradiating it with ultraviolet rays. Due to such a manufacturing method, the steps can be simplified, and, hence, a low manufacturing cost can be realized.

Further, according to another aspect of the method of manufacture of an organic electroluminescence display device of the present invention, after forming an outer wall layer which surrounds a region where anodes are formed, non-affinity regions are formed on surfaces of the anodes by exposing the light transmitting glass substrate under a saturated vapor pressure of an organic solvent, thus adhering organic substances to the surfaces of the anodes, and affinity regions are formed by irradiating ultraviolet rays to pixel center portions, except for electrode surface peripheral portions of the anodes. Accordingly, it is possible to increase the difference between the affinity and the non-affinity for a conductive polymer material solution between the ultra-violet ray irradiated portion and the ultra-violet ray non-irradiated portion.

In the method of manufacture of an organic electroluminescence display device of the present invention, it is preferable that the concentration of the organic black insulation material solution is larger than the concentration of the polymer light emitting material solution.

It is needless to say that the present invention is not limited to the above-mentioned manufacturing methods, and various modifications can be made without departing from the technical concept of the present invention as described in the claims.

DETAILED DESCRIPTION

The mode for carrying out the present invention will be explained in detail in conjunction with the drawings, which show various embodiments of the invention.

Figure 1:
FIG. 1 is a cross-sectional view showing one step in the method of manufacture of an organic electroluminescence display device according to the present invention.
Figure 2:
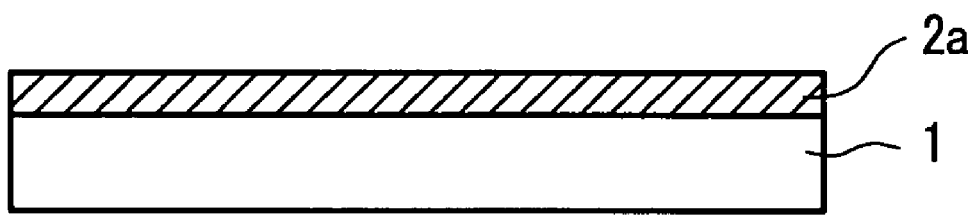
FIG. 2 is a cross-sectional view showing a next step which follows the step shown in FIG. 1.
Figure 3:
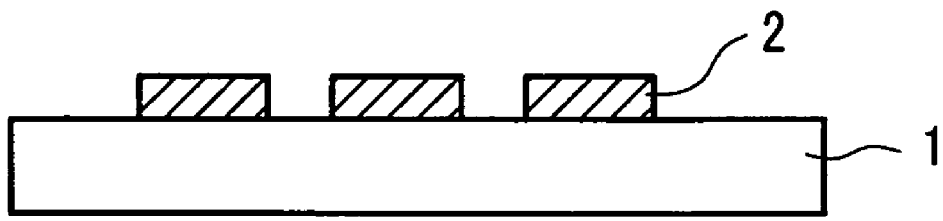
FIG. 3 is a cross-sectional view showing a next step which follows the step shown in FIG. 2.

FIG. 1 to FIG. 10 are cross-sectional views, partially including plan views, of respective steps in the method of manufacture of an organic electroluminescence display device according to the present invention. First of all, on a light transmitting glass substrate 1 having a thickness of approximately 1.1 mm, as shown in FIG. 1, an ITO film 2a having a film thickness of approximately 150 nm is formed by a sputtering method, as shown in FIG. 2. Thereafter, the ITO film 2a is partially etched by a photolithography method to form a plurality of anodes 2, which constitute pixel portions and have a size of approximately 150 μm×170 μm, by patterning for every pixel, as shown in FIG. 3.

Subsequently, on the glass substrate 1 on which these anodes 2 are formed, an organic material solution (ink) containing polyimide as a main component is formed into a film by a screen printing method such that the organic material solution surrounds a peripheral portion of the glass substrate 1, as shown in plan view in FIG. 4A; and, thereafter, baking is performed at a temperature of approximately 350° C. for approximately one hour, thus forming an outer wall layer 3 having a width of approximately 10 μm and a height of approximately 2 μm. Then, the structure is exposed under a saturated vapor pressure of propylene glycol monomethyl ether acetate (PGMEA) for approximately one hour so as to make an organic substance adhere to upper surfaces of the anodes 2, and the organic substance is subjected to a non-affinity treatment to obtain a non-affinity property.

Figure 4A:
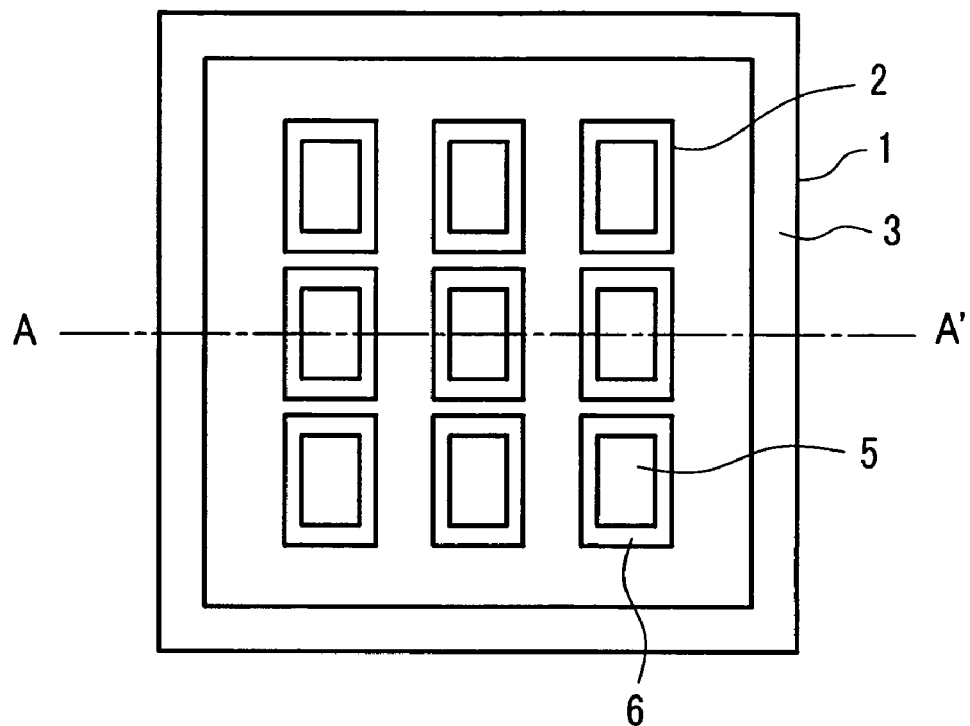
FIG. 4A is a plan view showing a next step which follows the step shown in FIG. 3.
Figure 4B:
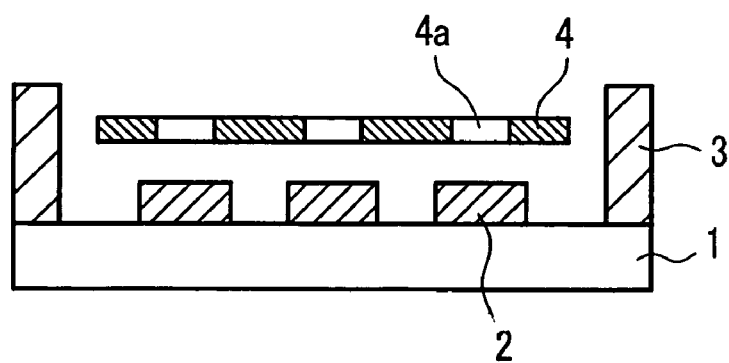
FIG. 4B is a cross-sectional view taken along line A-A' in FIG. 4A.

Then, as shown in cross-sectional view in FIG. 4B, using a photo mask 4 having openings 4a which allow light to pass therethrough to regions having a size of 130 μm×150 μm, which constitute pixel center portions on the respective anodes 2, ultraviolet rays or laser beams having a wavelength of not more than 254 nm are irradiated to only the pixel center portions at a level of approximately 5 J/cm$^2$, so as to effect photodecomposition of the previously adhered organic substance, so as to clean the upper surfaces of the pixel center portions, thus forming affinity regions 5, which exhibit an affinity with an organic material solution, as shown in FIG. 4A. Here, with respect to the upper surfaces of the respective anodes 2, since the upper surfaces of the portions of outer peripheries of the respective anodes 2 to which the ultraviolet rays are not irradiated are not cleaned, the upper surfaces assume a state of non-affinity regions 6, to which the previous organic substance is adhered.

Figure 5:
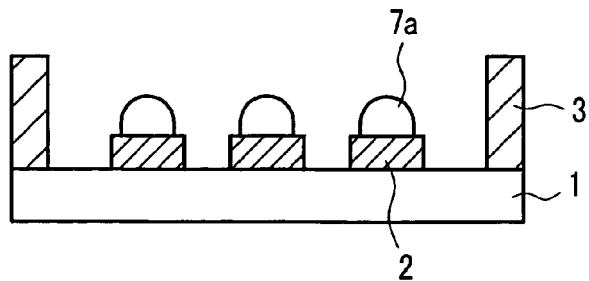
FIG. 5 is a cross-sectional view showing a next step which follows the step shown in FIG. 4A.
Figure 6:
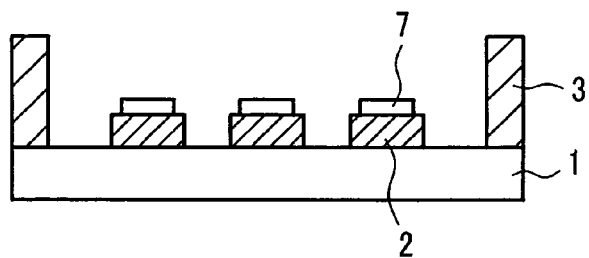
FIG. 6 is a cross-sectional view showing a next step which follows the step shown in FIG. 5.

Next, to upper surfaces of the affinity regions 5, which constitute the pixel center portions of the respective anodes 2, approximately 50 pl of a PEDOT/PSS solution (BAITRON P, a product of Bayer AG. (Leverkusen, Germany), for example) is blown off from a nozzle. After forming a PEDOT/PSS liquid layer 7a, as shown in FIG. 5, the structure is heated and dried at a temperature of approximately 120° C. for approximately 10 minutes, thus forming hole injection layers 7, as shown in FIG. 6. Here, PEDOT is an abbreviation for polyethylenedioxy-thiophene and PSS is an abbreviation for polystyrene sulfonic acid.

Figure 7:
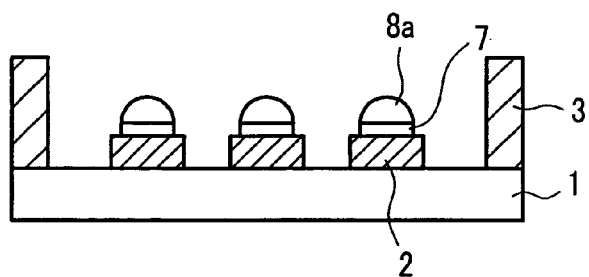
FIG. 7 is a cross-sectional view showing a next step which follows the step shown in FIG. 6.
Figure 8:
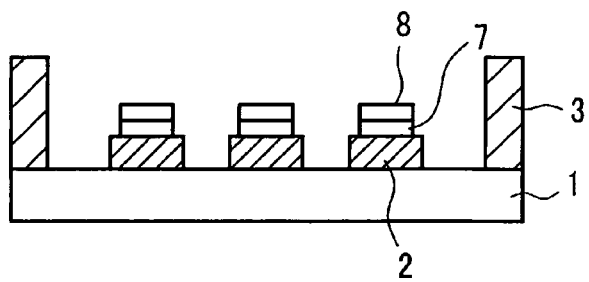
FIG. 8 is a cross-sectional view showing a next step which follows the step shown in FIG. 7.

Next, as shown in FIG. 6, to the upper surfaces of the hole injection layers 7, approximately 60 pl of polyfluorene-based polymer light emitting material solution is blown off from a nozzle by an ink jet method so as to form light emitting material layers 8a, as shown in FIG. 7, and, thereafter, the structure is heated and dried at a temperature of approximately 80° C. for approximately 20 minutes, as shown in FIG. 7, thus forming light emitting layers 8, as shown in FIG. 8.

Figure 9:
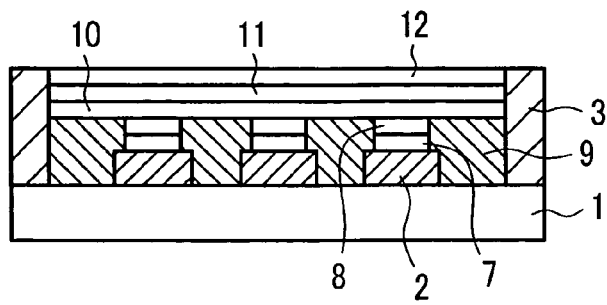
FIG. 9 is a cross-sectional view showing a next step which follows the step shown in FIG. 8.
Figure 10:
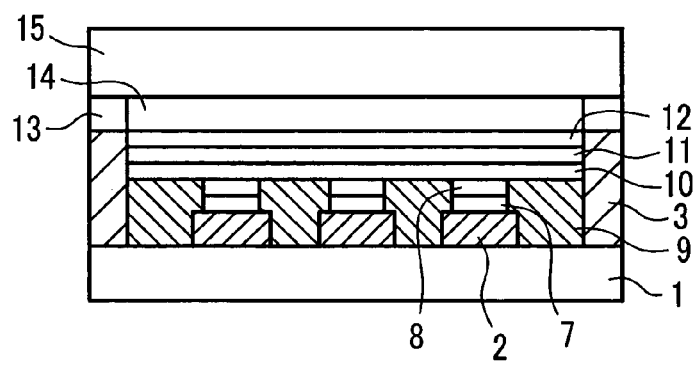
FIG. 10 is a cross-sectional view showing a next step which follows the step shown in FIG. 9.

Next, as a black bank material, a black insulation material solution, which is produced by dispersing black $CO_3O_4$ and a curing resin into propylene glycol monomethyl ether acetate (PGMEA), is injected to the inside of the glass substrate 1, which is surrounded by the outer wall layer 3, using an ink jet method or a nozzle coating method, as shown in FIG. 9, to an extent that the black insulation material solution is not adhered to upper surfaces of the light emitting layers 8; and, thereafter, the structure is baked at a temperature of approximately 100° C. for approximately 20 minutes, thus forming a black insulation layer 9 having a thickness of approximately 200 nm on peripheral portions of respective anodes 2.

In this case, to form the black insulation layer 9 while preventing the adhesion of the black insulation material solution to the light emitting layers 8, it is necessary to increase the solution concentration of the black insulation material solution and to form the thin film using a small quantity of black insulation material solution such that the black insulation material solution does not cover the light emitting layers 8. Accordingly, it is necessary to refine the solution concentration of the black insulation material solution to be higher than the solution concentration of the polymer light emitting material solution which forms the light emitting layer 8.

Thereafter, on an upper surface of the black insulation layer 9, a film made of lithium fluoride (LiF) and having a film thickness of approximately 0.5 nm is formed at a vapor evaporation speed of approximately 0.2 nm/sec, thus forming an electron injection layer 10. Further, under a vacuum of approximately 10$^{-6}$ torr, a film made of calcium (Ca) and having a film thickness of approximately 100 nm is formed at a vapor evaporation speed of approximately 1 nm/sec, thus forming a cathode 11. Finally, under a vacuum of approximately 10$^{-6}$ torr, a film made of aluminum (Al) and having a film thickness of approximately 100 nm is formed at a vapor evaporation speed of approximately 1 nm/sec, thus forming a protective film 12.

Next, the glass substrate 1 on which the cathode 11 and the protective film 12 are formed is transferred to a sealing globe box (not shown in the drawing). Then, the glass substrate 1 is arranged to face a glass substrate 15, which preliminarily has a desiccating agent 14 laminated to the inside thereof, in an opposed manner and is sealed to the glass substrate 15 using, for example, an epoxy-based sealing material 13, which constitutes an ultraviolet-ray type polymer resin, and the sealing is completed by curing the epoxy-based sealing material 13 with irradiation of ultraviolet rays.

In the organic electroluminescence display device formed in the above-mentioned manner, when a given DC voltage is applied between the anodes 2 and the cathode 11, a green light emission is obtained. When the voltage-luminance characteristic is measured, a luminance of approximately 1000 cd/cm$^2$ is obtained with a voltage of approximately 5.5V. The contrast ratio at this time is approximately 150:1, and, hence, a high contrast ratio is obtained. Further, when the pixel portions provided for red and blue light emissions are respectively formed at other neighboring anodes 2 in the same manner, it is possible to obtain substantially the same light emission luminance, and, hence, it is possible to obtain substantially the same high contrast ratio.

In such a method of manufacture of an organic electroluminescence display device, the ultraviolet rays are irradiated to the upper surfaces of the anodes 2 formed for respective pixels at pixel center portions, except for the outer peripheral portions. Accordingly, the change attributed to the difference in wettability between the affinity regions 5 formed of the ultraviolet-ray irradiated region and the non-affinity regions 6 formed of the ultraviolet-ray non-irradiated region with respect to the hole injection layers 7 becomes explicit; and, due to this difference in wettability, the hole injection layers 7 and the light emitting layers 8 are stacked and formed using an organic material solution only on the pixel center portions on the upper surfaces of the anodes 2, except for the outer peripheral portions. Accordingly, with the use of the organic material solution, it is possible to drop a so-called polymer-based material, with which it is difficult to perform vapor evaporation, to the anodes 2 using sublimation on the upper surfaces of the anodes 2 by an ink jet method.

Further, in the method of manufacture of an organic electroluminescence display device, the black insulation layer 9 that separates the anodes 2 which constitute the pixel portions, from each other is formed after forming the films of light emitting layers 8. Accordingly, it is possible to completely eliminate a so-called creeping phenomenon of a pattern in which the hole injection layers 7 and the light emitting layers 8 creep from the upper surfaces of the anodes 2 to the side wall of the black insulation layer 9, which phenomenon has been considered unavoidable in the conventionally performed ink jet process, whereby the film-thickness flatness of the hole injection layers 7 and the light emitting layers 8 can be enhanced.

According to such a method of manufacture of an organic electroluminescence display device, it is possible to omit a step of forming an insulation layer by a photolithography method and a step of applying the surface treatment to the insulation layer, which steps were conventionally performed, and, hence, the processing steps can be simplified, thus leading to a reduction of the manufacturing cost.

Further, conventionally, the polymer concentration of the organic material solution was approximately 0.2 to 5%, and, hence, to ensure that the organic material solution for forming the hole injection layer and the light emitting layer will have a thickness of several tens nm in the inside of a pixel having an approximately recessed cross section, it is necessary to form an insulation layer having a thickness of approximately 5 μm. However, when the height of the insulation layer is large, a disconnection attributed to broken steps of the cathode is liable to easily occur due to the stepped portions, thus giving rise to a drawback that the yield rate is lowered. According to the method of manufacture of an organic electroluminescence display device of the present invention, it is possible to lower the height of the insulation layer 9, that is, so that it is not more than 1 μm, and, hence, the occurrence of a lowering of the yield rate due to the occurrence of broken steps of the cathode 11 can be totally eliminated, whereby the acquisition of a high productivity and a high reliability can be expected.

Further, the reason why the black insulation layer having a thickness of several μm was formed by a photolithography method conventionally lies in the fact that the increase of the height of the insulation layer is extremely difficult with a view toward assuring the desired optical transmissivity. According to the method of manufacture of an organic electroluminescence display device of the present invention, since the insulation layer 9 can be formed without using the photolithography method, it is possible to easily blacken the insulation layer 9, whereby the contrast ratio can be largely enhanced.

Further, when the organic material solution is injected into the inside of the non-affinity insulation layer, there may be a case in which the film thickness is large at the center portion of the pixel and small at the peripheral portion of the pixel, thus giving rise to the occurrence of color irregularities and a lowering of reliability. However, according to the method of manufacture of an organic electroluminescence display device of the present invention, although the organic material solution which is blown off to the region where the insulation layer 9 is not formed exhibits a large film thickness at the peripheral portion, the flatness at the center portion is enhanced, and, hence, the occurrence of color irregularities can be eliminated, whereby the reliability of the organic electroluminescence element is enhanced.

Here, in the above-mentioned embodiment, as the organic solvent which makes the organic substance adhere to the upper surfaces of the anodes 2 and makes the upper surfaces of the anodes 2 achieve non-affinity, propylene glycol monomethyl ether acetate (PGMEA) is used, for example. However, as other examples of an organic solvent, for example, propylene glycol monomethyl ether (PGME), ethylene glycol monomethyl ether, ethylene glycol dimethyl ether, ethylene glycol diethyl ether, N-methylpyrrolidone, tetrahydrofuran, cyclohexane, ethanol, propyl alcohol, isopropyl alcohol, t-butanol, ethyl acetate, methyl acetate, butyl acetate, isoamyl acetate, ethyl lactate, acetone, methyl amyl ketone, methyl ethyl ketone, cyclohexane, cyclopentanone or the like can be used.

Further, with respect to the polymer which forms the above-mentioned black insulation layer 9, as an organic solvent which does not dissolve the hole injection layers 7 or the light emitting layers 8, for example, propylene glycol monomethyl ether acetate (PGMEA) is used. However, as another example of the organic solvent, it is possible to use a polymer which can be dissolved in, for example, cyclohexanone, cyclopenthanone, ethylene glycol mono alkyl ether, ethylene glycol mono alkyl ether acetate, propylene glycol mono alkyl ether, propylene glycol mono alkyl ether acetate, ethyl lactate, N-methylpyrrolidone or the like.

Further, as the pigment which forms the black insulation layer 9, for example, $CO_3O_4$ is used. However, as another example of this pigment, $TiO_2$, insulation carbon black (carbon black which is covered with resin) or the like can be used.

Further, as the polymer material which is applicable to the present invention, phenol resin, novolac resin, epoxy resin, amino resin, polyamic acid, polyacrylic acid, polyacrylic/acrylic ester copolymer, acrylic acid/styrene copolymer, methacrylic acid/styrene copolymer, polyvinyl acetate, polyacrylic alkyl ester, polymethacrylic alkyl ester, styrene/maleic anhydride copolymer, styrene/maleimide copolymer, styrenefmethyl maleimide copolymer, polymethacrylic acid, polyvinyl pyrrolidone, acrylic acid/styrene/benzil methacrylate copolymer or the like can be used.

Next, another embodiment of the method of manufacture of the organic electroluminescence display device according to the present invention will be explained in conjunction with the drawings. First of all, on the upper surface of the light transmitting glass substrate 1 having a thickness of approximately 1.1 mm, as shown in FIG. 1, an ITO film 2a having a thickness of approximately 150 nm is formed by a sputtering method, as shown in FIG. 2. Next, the ITO film 2a is partially etched by a photolithography method to form anodes 2 having a size of 150 μm×170 μm, which constitute pixel portions by patterning, as shown in FIG. 3.

Subsequently, on the upper surface of the light transmitting glass substrate 1 on which the anodes 2 are formed, photosensitive polyimide having a thickness of approximately 3 μm is applied to the whole surface of the light transmitting glass substrate 1 by a spin coating method, and it is partially etched by a photolithography method; and, thereafter, the structure is baked at a temperature of approximately 200° C. for approximately 30 minutes such that an outer wall layer 3 having a width of approximately 10 μm and a height of approximately 2 μm, which surrounds a peripheral portion of the glass substrate 1, is formed, as shown in the plan view of FIG. 4A.

Further, the structure is exposed to a saturated vapor pressure of propylene glycol monomethyl ether acetate (PG-MEA) for approximately 1 hour so as to make the upper surfaces of the anodes 2 achieve non-affinity.

However, when a sufficiently obtained non-affinity state on the upper surfaces of the anodes 2 is already realized by forming the outer wall layer 3 by the above-described photolithography method, this non-affinity processing on the upper surfaces of the anodes 2, which makes the organic substances adhere to the upper surfaces of the anodes 2, is not specifically necessary. Thereafter, the organic electroluminescence display device is completed through processes similar to the processes employed in the above-mentioned embodiment.

In such a method of manufacture of the organic electroluminescence display device, by making the upper surfaces of the anodes 2 obtain the sufficient non-affinity at the time of forming the outer wall layer 3, the non-affinity imparting step, which makes organic substances adhere to the upper surfaces of the anodes 2 as a next step, can be omitted, and, hence, exactly the same effects as those achieved in the above-mentioned embodiments can be obtained even when the steps are shortened.

Figure 11:
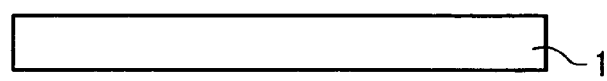
FIG. 11 is a cross-sectional view showing a step in an example of a method of manufacture which is compared with a method of manufacture of an organic electroluminescence display device according to the present invention.
Figure 12:
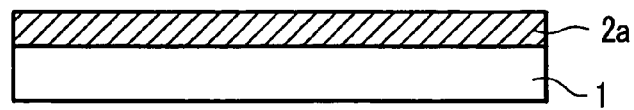
FIG. 12 is a cross-sectional view showing a next step which follows the step shown in FIG. 11.
Figure 13:
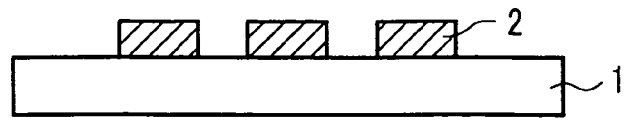
FIG. 13 is a cross-sectional view showing a next step which follows the step shown in FIG. 12.
Figure 14:
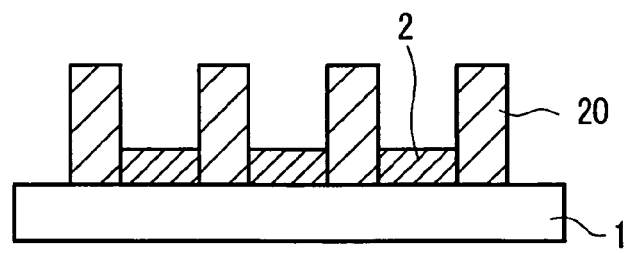
FIG. 14 is a cross-sectional view showing a next step which follows the step shown in FIG. 13.

FIG. 11 to FIG. 18 are cross-sectional views showing respective steps in a comparative example of a method of manufacture of the organic electroluminescence display device according to the present invention. In these figures, the same symbols are used to identify parts that are identical to the parts shown in the above-mentioned drawings, and repeated explanations thereof are omitted. On the upper surface of the light transmitting glass substrate 1 having a thickness of approximately 1.1 mm, as shown in FIG. 11, an ITO film 2a having a thickness of approximately 150 nm is formed by a sputtering method, as shown in FIG. 12. Next, the ITO film 2a is partially etched by a photolithography method, as shown in FIG. 13, to form anodes 2 of an ITO film 2a having sizes of 150 μm×170 μm, which constitute pixel portions, by patterning.

Next, to the upper surface of the glass substrate 1 on which the anodes 2 are formed, an acrylic polymer resin is applied, such that the polymer resin surrounds the anodes 2 which constitute the pixel portions, and banks 20 having a film thickness of approximately 4 μm are formed by etching using a photolithography method. Thereafter, a fluorine plasma treatment is performed, and non-affinity is imparted to the banks 20. Next, after the glass substrate 1 on which the anodes 2 and the banks 20 are formed is cleaned, residual organic components on the upper surfaces of the anodes 2 are removed.

Figure 15:
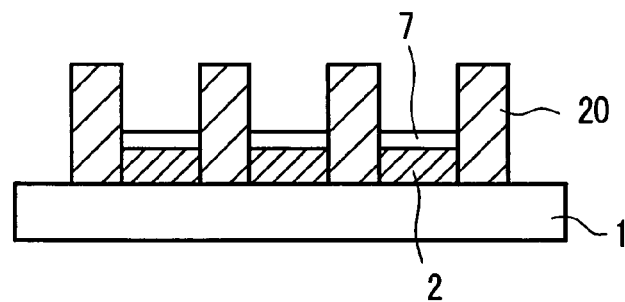
FIG. 15 is a cross-sectional view showing a next step which follows the step shown in FIG. 14.
Figure 16:
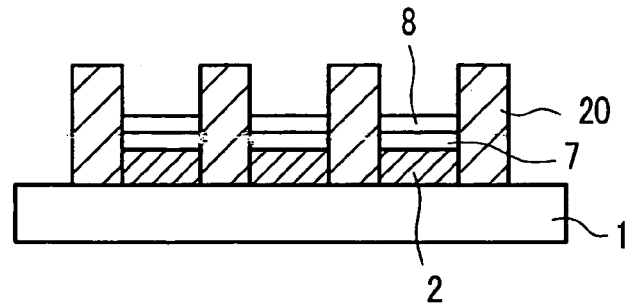
FIG. 16 is a cross-sectional view showing a next step which follows the step shown in FIG. 15.
Figure 17:
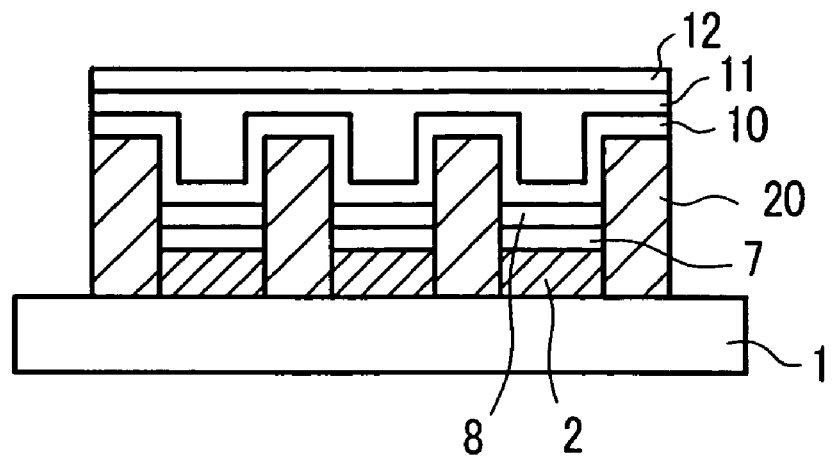
FIG. 17 is a cross-sectional view showing a next step which follows the step shown in FIG. 16.
Figure 18:
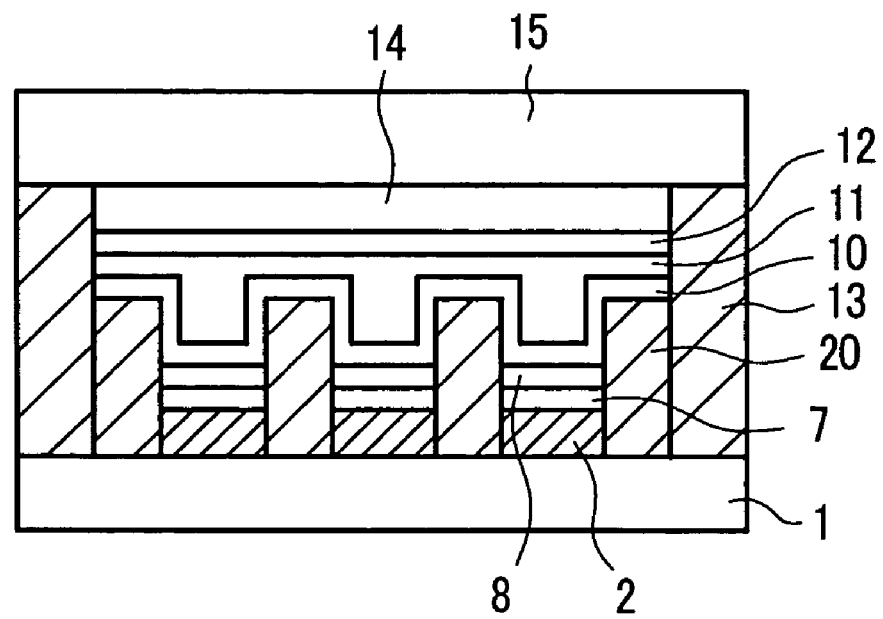
FIG. 18 is a cross-sectional view showing a next step which follows the step shown in FIG. 17.

Next, to the upper surfaces of the anodes 2, approximately 50 pl of PEDOT/PSS aqueous solution (for example, Baytron P, a product of Bayer AG.) is blown off from a nozzle by an ink jet method so as to form a PEDOT/PSS liquid layer. Thereafter, the structure is heated and dried at a temperature of approximately 120° C. for approximately 10 minutes, thus forming hole injection layers 7, as shown in FIG. 15.

Next, to the upper surfaces of the hole injection layers 7, approximately 60 pl of a poly-fluorine-based polymer light emitting material is blown off from a nozzle using an ink jet method so as to form light emitting material layers. Thereafter, the structure is heated and dried at a temperature of approximately 80° C. for approximately 20 minutes so as to form a light emitting layer 8 having a thickness of approximately 40 nm. Thereafter, an electron injection layer 10 is formed. Further, under a vacuum of approximately $10^{-6}$ torr, a film made of calcium (Ca) having a thickness of approximately 100 nm is formed with a vapor deposition speed of 1 nm/sec so as to form a cathode 11. Further, under a vacuum of approximately $10^{-6}$ torr, a film made of aluminum (Al) having a thickness of approximately 100 nm is formed with a vapor deposition speed of 1 nm/sec so as to form a protective film 12.

Next, the glass substrate 1 on which the cathode 11 and the protective film 12 are formed is moved to a sealing globe box (not shown in the drawing). Using a polymer-resin-based sealing material 13 of an ultraviolet-ray-curing type, the glass substrate 1 is arranged to face the glass substrate 15, thereby causing a drying agent 14 to be preliminarily adhered to the inside thereof, and it is sealed to the glass substrate 15. The sealing of the glass substrate 1 to the glass substrate 15 is completed by irradiating ultraviolet rays to the polymer-resin-based sealing material 13 so as to cure the sealing material 13.

In the organic electroluminescence display device which is formed in such a manner, when a given DC voltage is applied between the anodes 2 and the cathode 11, a green light emission is obtained. Then, when the voltage-luminance characteristic is measured, a luminance of approximately 1000 cd/cm$^2$ is obtained at approximately a voltage of 5.5V. The contrast ratio here is approximately 80:1.

Here, in the description of the above-mentioned embodiments, an explanation has been given with respect to a case in which, by surely holding the organic material solvent (ink) at given pixel positions in response to a change in the surface energy of the anodes generated by the irradiation of an energy line, the anodes, the hole injection layer and the light emitting layer are formed, and, thereafter, the formation of the black insulation layer is realized. However, it is needless to say that the present invention is not limited to this case, and the present invention is applicable to the formation of a polymer-based organic electroluminescence element, a color filter or an organic thin film transistor or the like which is used for a flat light source, a flat display or the like and is manufactured by an ink jet method.

As has been explained heretofore, according to the manufacturing method of manufacture an organic electroluminescence display device according to the present invention, it is possible to obtain extremely advantageous effects. That is, it is possible to easily realize a reduction of the manufacturing cost attributed to simplification of the manufacturing steps, an enhancement of the productivity attributed to an enhancement of the yield rate, an enhancement of the reliability attributed to a high contrast ratio, and an enhancement of the display quality in which no color irregularities or the like are generated, whereby it is possible to obtain an organic electroluminescence display device of high productivity, high quality and high reliability.

What is claimed is:

1. A method of manufacturing an organic electroluminescence display device, comprising:
   (a) forming a lower electrode over a substrate;
   (b) forming an organic hole injection layer over the lower electrode, after step (a);
   (c) forming an organic light emitting layer over the organic hole injection layer, after step (b);
   (d) forming an insulating layer functioning as a partition between neighboring pixels, after step (c);
   (e) forming an electron injection layer over the organic hole injection layer and the insulating layer, after step (d); and
   (f) forming a cathode on the electron injection layer, after step (e).

* * * * *